United States Patent [19]
Dreps et al.

[11] Patent Number: 6,084,432
[45] Date of Patent: Jul. 4, 2000

[54] DRIVER CIRCUIT HAVING REDUCED NOISE

[75] Inventors: Daniel Mark Dreps, Georgetown; Douglas Ele Martin, Round Rock, both of Tex.

[73] Assignee: International Business Machines Corporation, Armonk, N.Y.

[21] Appl. No.: 09/050,162

[22] Filed: Mar. 30, 1998

[51] Int. Cl.[7] .......................... H03K 17/16; H03K 19/175
[52] U.S. Cl. ................................ 326/83; 326/83; 326/86; 326/21; 326/26; 326/27; 326/29; 326/30
[58] Field of Search ................................ 326/83, 86, 26, 326/27, 29, 21, 30

[56] References Cited

U.S. PATENT DOCUMENTS

| | | | |
|---|---|---|---|
| 4,859,877 | 8/1989 | Cooperman et al. | 307/443 |
| 4,952,818 | 8/1990 | Erdelyi et al. | 307/270 |
| 5,089,722 | 2/1992 | Amedeo | 307/443 |
| 5,448,181 | 9/1995 | Chiang | 327/27 |
| 5,633,600 | 5/1997 | Ohnishi | 326/17 |
| 5,699,000 | 12/1997 | Ishikuri | 327/108 |
| 5,717,343 | 2/1998 | Kwong | 326/27 |
| 5,801,563 | 9/1998 | McClure | 327/170 |

*Primary Examiner*—Michael Tokar
*Assistant Examiner*—Vibol Tan
*Attorney, Agent, or Firm*—Kelly K. Kordzik; Winstead Sechrest & Minick P.C.; Anthony V. S. England

[57] ABSTRACT

A driver circuit has an output node coupled to a chip pad. A first PFET and a first resistor are connected between a power supply and the output node, wherein the first resistor is connected between the first PFET and the output node. A first NFET and a second resistor are connected between a ground potential and the output node, wherein the second resistor is connected between the first NFET and the output node. A third resistor is connected between an input to the driver circuit and a gate electrode of the first PFET. A fourth resistor is connected between the input to the driver circuit and a gate electrode of the first NFET. The pre-drive circuitry for driving the input to the PFET may include an NFET coupled between the ground potential and the input, wherein the gate electrode of the NFET receives the data signal to be driven. The NFET pre-drive circuitry may include a PFET coupled between the power supply and the input to the NFET portion of the driver circuit, wherein the gate electrode of this PFET also receives the data signal to be driven. A plurality of these driver circuits may be connected in parallel and in series in order to modify the output impedance.

6 Claims, 3 Drawing Sheets

DRIVER CIRCUIT HAVING REDUCED NOISE

TECHNICAL FIELD

The present invention relates in general to the driving of signals from an integrated circuit.

BACKGROUND INFORMATION

Data processing systems and other electronic circuitry are typically comprised of a plurality of integrated circuits each packaged within a chip. A printed circuit board ("PCB") is provided for mounting the chips and the interconnect lines electrically coupling the chips to each other.

Signals generated on a chip and intended for sending to another chip must be driven from the chip with driver circuitry to ensure the integrity of the data signals.

Chips are being manufactured with more and more I/O pads. When multiple signals are being driven from a chip simultaneously, there can be a huge drain on the power supply providing power to the driving circuitry at any one particular moment of time. Such a huge drain can result in a significant increase in switching noise. Therefore, there is a need in the art for improved driver circuitry for decreasing such switching noise.

SUMMARY OF THE INVENTION

The foregoing need is addressed by the present invention which provides a driver circuit having an output node coupled to a chip pad. A first PFET and a first resistor are connected between a power supply and the output node, wherein the first resistor is connected between the first PFET and the output node. A first NFET and a second resistor are connected between a ground potential and the output node, wherein the second resistor is connected between the first NFET and the output node. A third resistor is connected between an input to the driver circuit and a gate electrode of the first PFET. A fourth resistor is connected between the input to the driver circuit and a gate electrode of the first NFET.

The pre-drive circuitry for driving the input to the PFET may include an NFET coupled between the ground potential and the input, wherein the gate electrode of the NFET receives the data signal to be driven.

The NFET pre-drive circuitry may include a PFET coupled between the power supply and the input to the NFET portion of the driver circuit, wherein the gate electrode of this PFET also receives the data signal to be driven.

A plurality of these driver circuits may be connected in parallel and in series in order to modify the output impedance.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
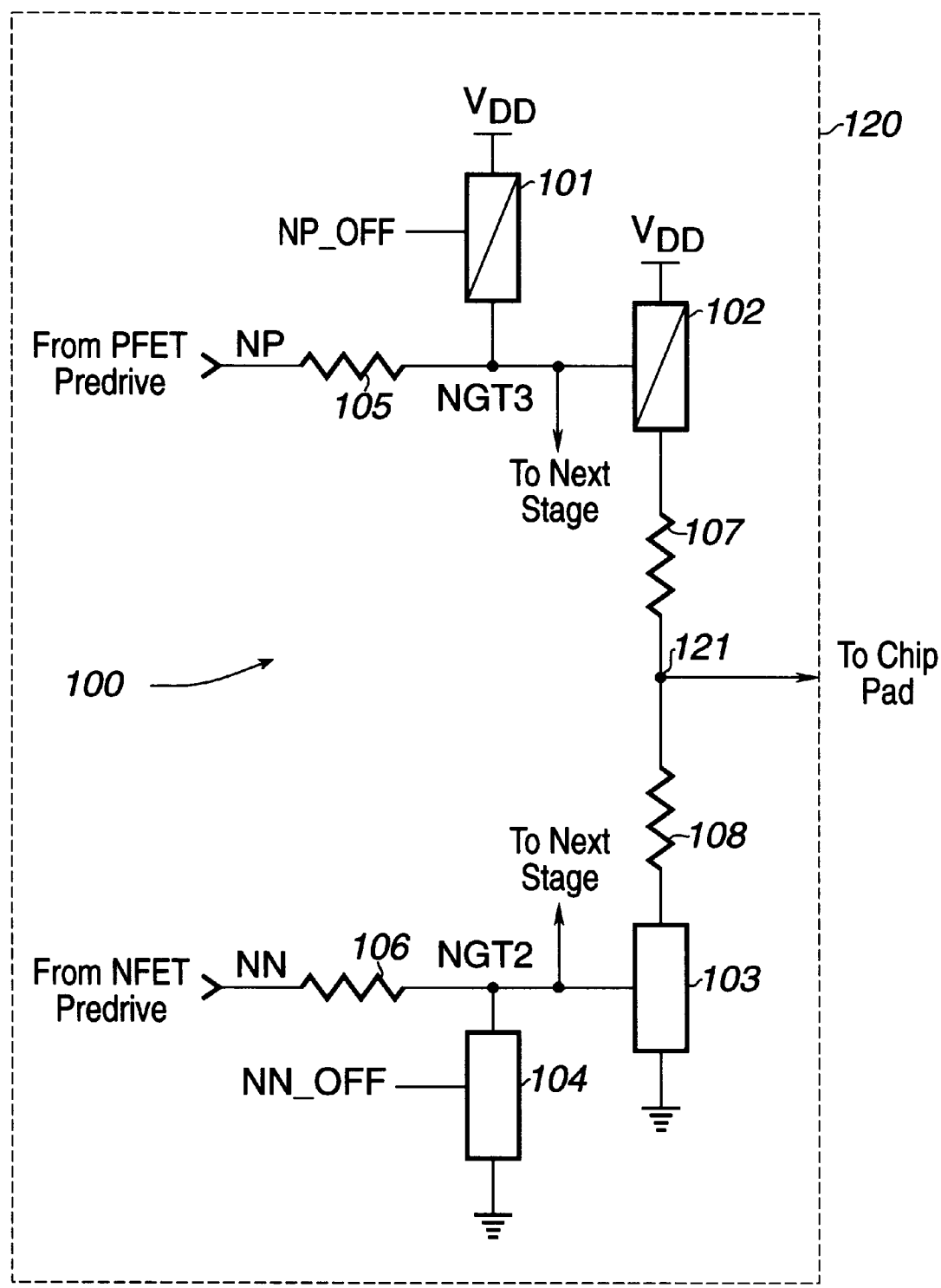
FIG. 1 illustrates a driver circuit in accordance with the present invention.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

By inserting resistive elements in the signal path of the driver circuits, for a 10% increase in delay of the output signal, a 50% decrease in di/dt noise can be achieved with the present invention.

Referring to FIG. 1, the dashed line labeled as 120 indicates a chip boundary on which a plurality of I/O pads provide access to internal circuitry (not shown) within chip 120. For purposes of the present invention, only one driver circuit 100 in accordance with the present invention is illustrated.

Driver circuit 100 is used as the final output stage of a switching driver. Implementation of driver circuit 100 uses resistors of some reasonable tolerance. Current advanced (deep-submicron) CMOS technologies usually offer a silicide block of the FET diffusion area. This diffusion can be used for implementing resistors that have a better tolerance than well resistance with much better bandwidth.

Driver circuit 100 will be designed at some appropriate impedance level (e.g., 450 ohms). The design of resistors 107 and 108 might be such that they become about one-half of the total output impedance. This is not a requirement, but merely a guideline. Such a resistance value could be more or less, but should be a percentage. The reason for this is the more the impedance ratio is pushed into resistors 107 and 108, the slower the stage delay becomes and the larger the cell size and power dissipation becomes.

From the PFET and NFET pre-drive circuitry (see FIG. 2), the respective signals are passed through resistors 105 and 106, respectively, and provided to the gate electrodes of PFET 102 and NFET 103, respectively.

Figure 2:
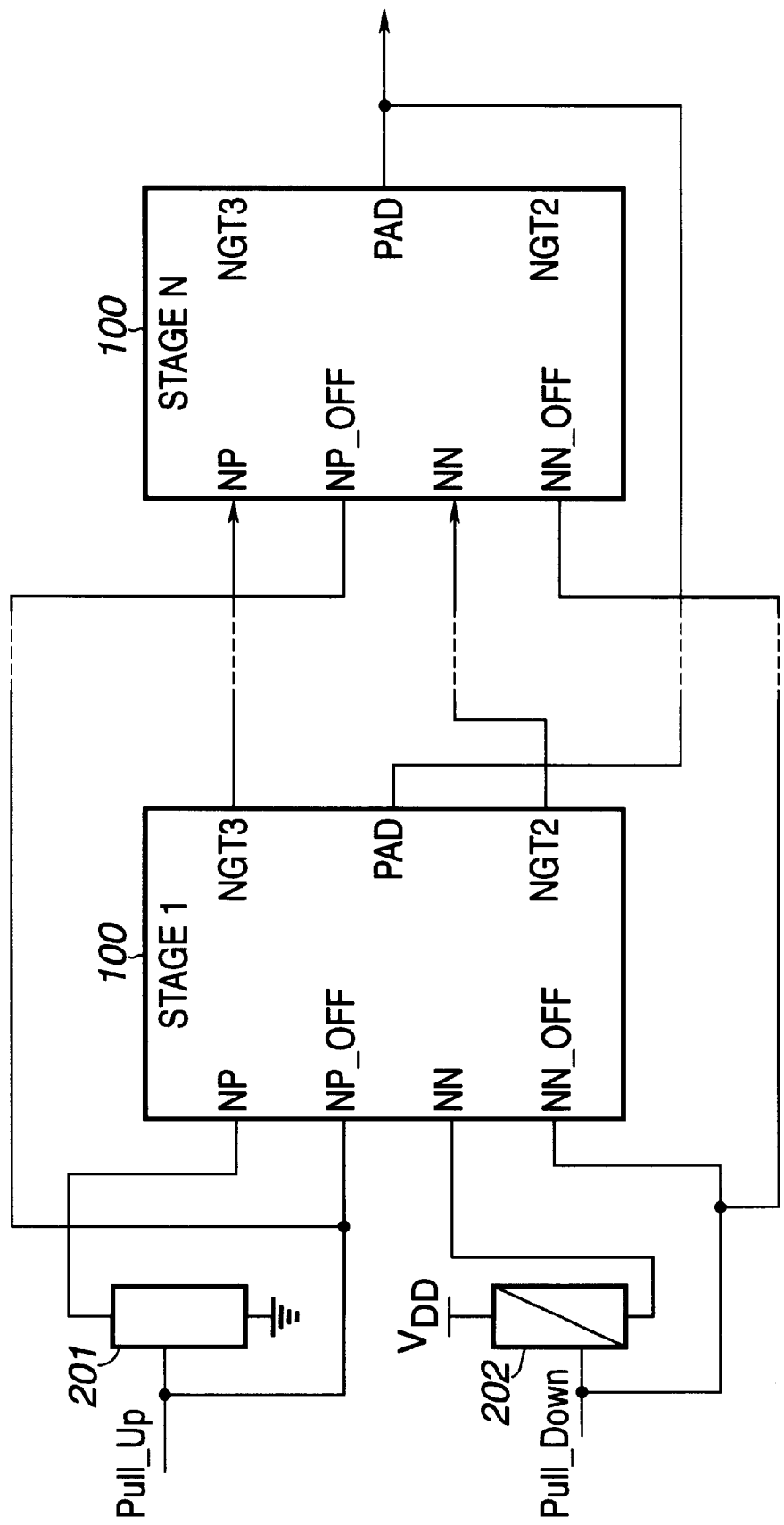
FIG. 2 illustrates an alternative embodiment of the present invention.
Figure 3:
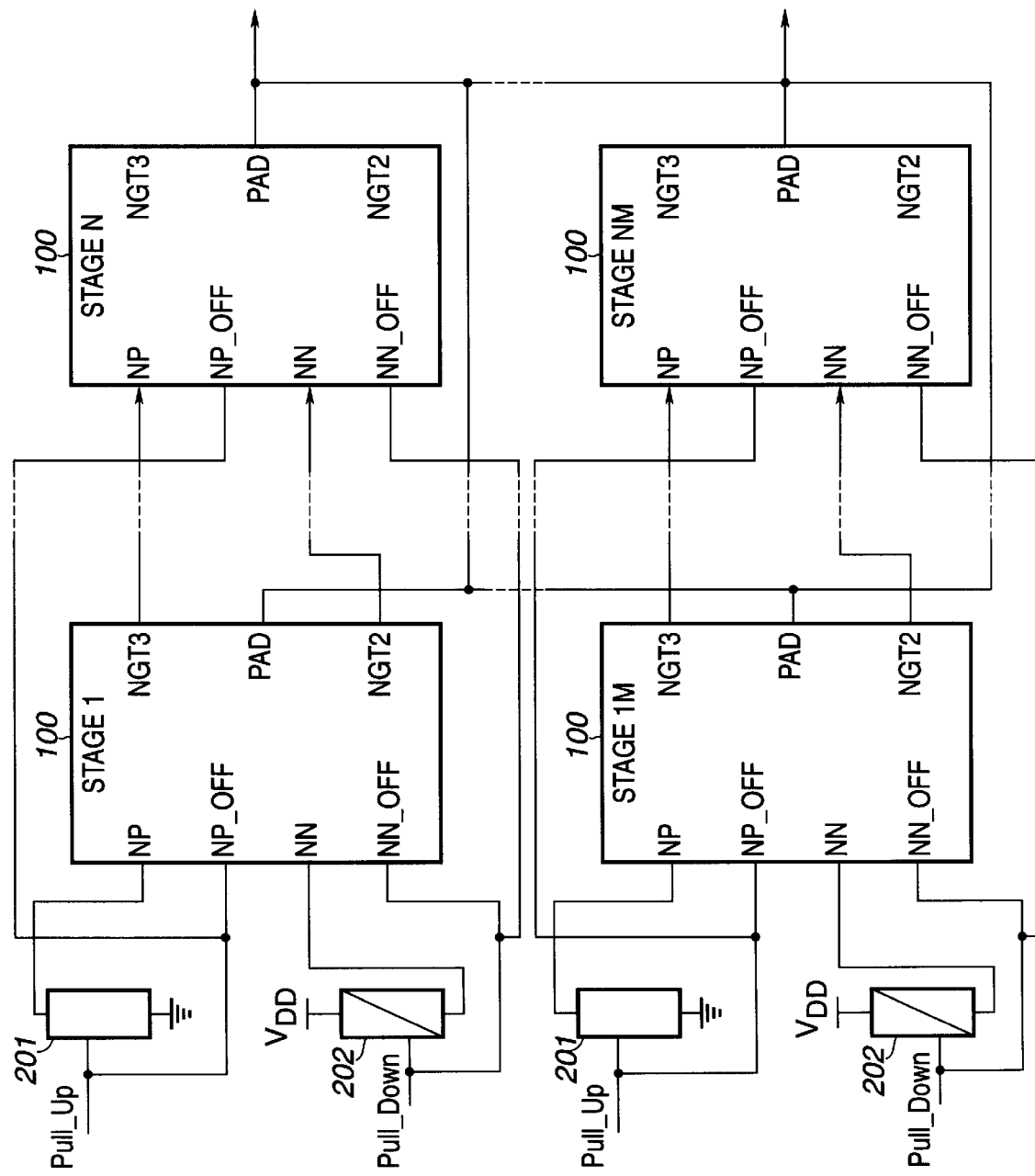
FIG. 3 illustrates another alternative embodiment of the present invention.

As will be further seen with respect to FIGS. 2 and 3, signals NP__OFF and NN__OFF are received by PFET 101 and NFET 104, respectively. When the signal to be driven from circuit 100 is high, signal NP will be forced low, turning on PFET 102 and thus driving node 121 high. Since signal NP__OFF is high, PFET 101 is turned off. However, signal NN__OFF, which is also high because of the high input signal, will turn on NFET 104 providing a ground signal to the gate electrode of NFET 103 turning it off. The reverse of this scenario occurs when the signal to be driven from driver circuit 100 is a low signal.

Resistors 105 and 106 are series gate resistors which are of the type described above using a silicide block of the FET diffusion area. The RC time constant of R105*(cg102+cd101) is calculated. The same is true for the bottom leg, i.e., R106*(cg103+cd104). The cg and cd are gate and drain capacitances, respectfully. Therefore, resistor 105 and resistor 106 are scalable based on required dv/dt and di/dt requirements. This scaling is done also as a function of the elemental impedance selected of block 120. If such an impedance is 350 ohms, and 50 ohms is required for 100 milliamps per nanosecond, then a solution for 7 stages of the 350 ohm elemental block will exist. If the solution of 25 ohms at 100 milliamps per nanosecond is required, the design may have to be 2 parallel legs of 7 segments with resistors 105 and 106 being 2 times the 50 ohm case.

Resistors 107 and 108 are series elements with devices 102 and 103 respectively. These devices are designed to be a percentage of the stack impedance. One reason for this is to simply protect devices 102 and 103 from an ESD event and secondly to better match the line impedance. Resistors 107 and 108 will typically have a much smaller variation in impedance than devices 102 and 103.

If driver circuit 100 is the only stage for driving the signals to the chip pad, then the signals NGT3 and NGT2 will not be provided to another stage. However, FIG. 2 illustrates an alternative embodiment where a plurality of N stages may be connected in series. In such a scenario, signal NGT3 is provided to the succeeding node NP in the next stage, while signal NGT2 is provided to node NN in the next stage.

The PFET pre-drive circuitry is further shown to include NFET 201, while the NFET pre-drive circuitry includes PFET 202.

By serially combining a plurality of driver circuits 100, the proper output impedance can be achieved. There may be a limit on how many N stages can be connected in this manner. At some point, it is likely that a second fork of N stages would have to be tied in.

FIG. 3 illustrates how N stages of driver circuit 100 can be connected in series as shown in FIG. 2, while also providing the parallel connection of M sets of stages as shown in FIG. 3. The configuration in FIG. 3 provides a lower impedance if needed.

Although the present invention and its advantages have been described in detail, it should be understood that various changes, substitutions and alterations can be made herein without departing from the spirit and scope of the invention as defined by the appended claims.

What is claimed is:

1. A driver circuit comprising:
an output node;
a first PFET and a first resistor connected between a power supply and the node, wherein the first resistor is connected between the first PFET and the node;
a first NFET and a second resistor connected between a ground potential and the node, wherein the second resistor is connected between the first NFET and the node;
a third resistor connected between an input to the driver circuit and a gate electrode of the first PFET;
a fourth resistor connected between the input to the driver circuit and a gate electrode of the first NFET;
a second PFET and a fifth resistor connected between the power supply and the node, wherein the fifth resistor is connected between the second PFET and the node;
a second NFET and a sixth resistor connected between the ground potential and the node, wherein the sixth resistor is connected between the second NFET and the node;

a seventh resistor connected between the gate electrode of the first PFET and a gate electrode of the second PFET; and
an eighth resistor connected between the gate electrode of the first NFET and a gate electrode of the second NFET.

2. The driver circuit as recited in claim 1, further comprising:
a third PFET and a ninth resistor connected between the power supply and the node, wherein the ninth resistor is connected between the third PFET and the node;
a third NFET and a tenth resistor connected between the ground potential and the node, wherein the tenth resistor is connected between the first NFET and the node;
an eleventh resistor connected between the input to the driver circuit and a gate electrode of the third PFET;
a twelfth resistor connected between the input to the driver circuit and a gate electrode of the third NFET;
a fourth PFET and a thirteenth resistor connected between the power supply and the node, wherein the thirteenth resistor is connected between the fourth PFET and the node;
a fourth NFET and a fourteenth resistor connected between the ground potential and the node, wherein the fourteenth resistor is connected between the fourth NFET and the node;
a fifteenth resistor connected between the gate electrode of the third PFET and a gate electrode of the fourth PFET; and
a sixteenth resistor connected between the gate electrode of the third NFET and a gate electrode of the fourth NFET.

3. A driver circuit comprising:
an output node;
a first PFET and a first resistor connected between a power supply and the node, wherein the first resistor is connected between the first PFET and the node;
a first NFET and a second resistor connected between a ground potential and the node, wherein the second resistor is connected between the first NFET and the node;
a third resistor connected between an input to the driver circuit and a gate electrode of the first PFET;
a fourth resistor connected between the input to the driver circuit and a gate electrode of the first NFET;
a second PFET connected between the power supply and the gate electrode of the first PFET, wherein a gate electrode of the second PFET is coupled to the input;
a second NFET connected between the ground potential and the gate electrode of the first NFET, wherein a gate electrode of the second NFET is coupled to the input;
a third NFET connected between the ground potential and the input, wherein a gate electrode of the third NFET is connected to the gate electrode of the second PFET; and
a third PFET connected between the power supply and the input, wherein a gate electrode of the third PFET is connected to the gate electrode of the second NFET, wherein the gate electrodes of the third PFET and the third NFET receive a data signal to be driven by the driver circuit.

4. A driver circuit comprising:
an output node connected to a chip pad;
a first PFET coupled between a power supply and the node;

a first NFET coupled between a ground potential and the node;

a first resistor connected between an input to the driver circuit and a gate electrode of the first PFET;

a second resistor connected between the input to the driver circuit and a gate electrode of the first NFET;

a second PFET coupled between the power supply and the node;

a second NFET coupled between the ground potential and the node;

a third resistor connected between the gate electrode of the first PFET and a gate electrode of the second PFET; and a fourth resistor connected between the gate electrode of the first NFET and a gate electrode of the second NFET.

5. The driver circuit as recited in claim 4, further comprising:

a third PFET coupled between the power supply and the node;

a third NFET coupled between the ground potential and the node;

a fifth resistor connected between the input to the driver circuit and a gate electrode of the third PFET;

a sixth resistor connected between the input to the driver circuit and a gate electrode of the third NFET;

a fourth PFET coupled Between the power supply and the node;

a fourth NFET coupled between the ground potential and the node;

a seventh resistor connected between the gate electrode of the third PFET and a gate electrode of the fourth PFET; and an eighth resistor connected between the gate electrode of the third NFET and a gate electrode of the fourth NFET.

6. A driver circuit comprising:

an output node connected to a chip pad;

a first PFET coupled between a power supply and the node;

a first NFET coupled between a ground potential and the node;

a first resistor connected between an input to the driver circuit and a gate electrode of the first PFET;

a second resistor connected between the input to the driver circuit and a gate electrode of the first NFET;

a second PFET connected between the power supply and the gate electrode of the first PFET, wherein a gate electrode of the second PFET is coupled to the input;

a second NFET connected between the ground potential and the gate electrode of the first NFET, wherein a gate electrode of the second NFET is coupled to the input;

a third NFET connected between the ground potential and the input, wherein a gate electrode of the third NFET is connected to the gate electrode of the second PFET; and a third PFET connected between the power supply and the input, wherein a gate electrode of the third PFET is connected to the gate electrode of the second NFET, wherein the gate electrodes of the third PFET and the third NFET receive a data signal to be driven by the driver circuit.

* * * * *